(12) United States Patent
Blattner et al.

(10) Patent No.: US 7,047,984 B2
(45) Date of Patent: May 23, 2006

(54) DEVICE AND METHOD FOR CLEANING ARTICLES USED IN THE PRODUCTION OF SEMICONDUCTOR COMPONENTS

(75) Inventors: Jakob Blattner, Ermatingen (CH); Rudy Federici, Berg (CH)

(73) Assignee: Brooks Automation, Inc., Chelmsford, MA (US)

( * ) Notice: Subject to any disclaimer, the term of this patent is extended or adjusted under 35 U.S.C. 154(b) by 366 days.

(21) Appl. No.: 10/312,396

(22) PCT Filed: Jun. 26, 2001

(86) PCT No.: PCT/CH01/00402

§ 371 (c)(1),
(2), (4) Date: Feb. 19, 2003

(87) PCT Pub. No.: WO02/01292

PCT Pub. Date: Jan. 3, 2002

(65) Prior Publication Data

US 2003/0159712 A1    Aug. 28, 2003

(30) Foreign Application Priority Data

Jun. 27, 2000    (CH) .................................. 1270/00

(51) Int. Cl.
*B08B 6/00* (2006.01)

(52) U.S. Cl. .................. 134/1.3; 15/1.51; 15/405; 15/409; 15/415.1; 15/345; 34/60; 34/61; 34/85; 134/1; 134/34; 134/36; 134/94.1; 134/102.1; 134/103.2; 134/133; 134/137; 134/151; 134/198; 134/199; 134/37

(58) Field of Classification Search ......... 15/345, 15/409, 415.1, 1.51, 405; 134/199, 198, 134/151, 133, 137, 103.2, 34, 1.3, 102.1, 134/1, 94.1; 34/60, 61, 85

See application file for complete search history.

(56) References Cited

U.S. PATENT DOCUMENTS

| | | | | |
|---|---|---|---|---|
| 5,478,401 A | * | 12/1995 | Tsunekawa et al. | 134/1 |
| 5,584,938 A | * | 12/1996 | Douglas | 134/1.3 |
| 5,669,979 A | * | 9/1997 | Elliott et al. | 134/1 |
| 5,916,374 A | | 6/1999 | Casey et al. | |
| 5,967,156 A | * | 10/1999 | Rose et al. | 134/7 |

(Continued)

FOREIGN PATENT DOCUMENTS

DE    38 20 931 A1    12/1989

(Continued)

*Primary Examiner*—M. Kornakov
(74) *Attorney, Agent, or Firm*—Perman & Green, LLP; Richard Pickreign

(57) ABSTRACT

A cleaning device for use in the production of semiconductor components comprises two feed devices with which a fluid medium is guided across a respective surface of an object to be cleaned so that different faces of the object are simultaneously cleaned. At least two gas feeding devices, having one means each for directing a gas flow onto the surface of the object to be cleaned, open into a cleaning chamber supplying a pressurized cleaning gas. At least two extraction means are connected to the outside of the cleaning chamber for discharging the gas fed to the cleaning chamber. The object can be introduced into the cleaning chamber through at least one gap. At least two ionization means are used to ionize the gas and the particles that are present in the cleaning chamber. One ionization means each is mounted between a direction means and an extraction means.

18 Claims, 4 Drawing Sheets

U.S. PATENT DOCUMENTS

| | | | |
|---|---|---|---|
| 5,979,475 A * | 11/1999 | Satoh et al. | 134/140 |
| 6,055,742 A | 5/2000 | Kim | |
| 6,305,097 B1 * | 10/2001 | Salamati-Saradh et al. | 34/103 |
| 6,395,102 B1 * | 5/2002 | Salamati-Saradh et al. | 134/37 |
| 6,656,017 B1 * | 12/2003 | Jackson | 451/39 |
| 2002/0152636 A1 * | 10/2002 | Ernst et al. | 34/487 |

FOREIGN PATENT DOCUMENTS

| | | |
|---|---|---|
| DE | 42 37 767 A1 | 5/1994 |
| DE | EP 0875921 * | 11/1998 |
| JP | 62-172323 * | 7/1987 |
| JP | 1-241821 * | 9/1989 |

* cited by examiner

DEVICE AND METHOD FOR CLEANING ARTICLES USED IN THE PRODUCTION OF SEMICONDUCTOR COMPONENTS

BACKGROUND

1. Field

The exemplary embodiment described herein relates to a cleaning apparatus and a cleaning method for the production of semiconductor elements, such as electronic chips, memory elements and the like. According to a further aspect, the exemplary embodiments also relate to an apparatus for storing objects from semiconductor production.

2. Brief Description of Related Developments

Exposure masks (also known as reticles) are used in the fabrication of electronic components, such as for example chips or memory modules, to produce defined structures on substrates of the components by means of photochemical processes. Since these structures include interconnects in the micrometer or even nano range, and even tiny amounts of impurities on the substrate and/or exposure mask leads to scrap, i.e. products which do not satisfy the quality requirements, an extremely high level of cleanness is required. Therefore, components of this type are produced under clean and ultraclean room conditions. To protect the exposure masks from mechanical damage and soiling, they are stored and handled in cassettes or in magazines which are sealed in an airtight manner.

Relatively large particles can easily be detected and removed. The problems are caused by smaller particles, for example with dimensions of 10 μm to 20 μm, which it has hitherto only been possible to remove with a very high level of outlay. For this purpose, cleaning methods have been developed in which a liquid was used to wash the semiconductor production means or the corresponding components or their starting products. On the one hand, these cleaning methods entail a relatively high level of structural outlay in terms of the equipment required to carry them out. On the other hand, the washing liquids used have to be reprocessed or replaced by fresh liquids. Furthermore, the fact that the cleaned objects are wet immediately after the process and therefore have to be dried before they can be reused or processed further may be unsatisfactory.

However, it has been found that, despite these measures, it is not possible to avoid soiling of the exposure masks to a sufficient extent. Moreover, known cleaning apparatus have the drawback of requiring a relatively large footprint in semiconductor factories. This is disadvantageous in particular because relatively expensive installations for producing clean room conditions have to be installed in the factories, and the costs of these installations rise proportionally to the size of the factory.

U.S. Pat. No. 5,967,156 has disclosed a surface treatment apparatus in which different cleaning agents, namely an aerosol and another reagent, are discharged from two nozzles onto a single surface of a substrate, which is disadvantageous in process engineering terms. According to U.S. Pat. No. 5,967,156, the reagent is extracted at a distance from the cleaning point without exploiting any geometry of the suction operation.

U.S. Pat. No. 5,857,474 has disclosed an apparatus and a corresponding method for washing a surface of a semiconductor product with frozen water which is supplied from a water supply nozzle and a gas supply for blowing the ice particles formed off the surface of the semiconductor product, which represents a combination of the drawbacks which have been outlined.

U.S. Pat. No. 6,055,742 has disclosed a reticle cleaning apparatus, in which a gas supply device is provided in the upper region of a cleaning chamber and a gate device and a conveyor device for supplying the reticles are also provided. Since an apparatus of this type—for design reasons since the reticles are secured in the cleaning chamber—can only be used to clean one side of a reticle, this has the drawback of a large footprint if a second cleaning apparatus is to be provided for the second side. The disclosure of an apparatus which is known from JP-A 03 155 550 and in which a surface of a semiconductor product is inspected by blowing off foreign bodies and then observing the effect does not go any further than the content of disclosure of U.S. Pat. No. 6,055,742.

JP-A 04 151 153 has disclosed an apparatus and a corresponding method in which, in a scanning mode, a compressed gas is passed onto a surface of a semiconductor product which is to be checked in order to be able to draw a functional distinction between defects in the semiconductor product and contaminating particles thereon.

JP-A 61 087326 has disclosed a method for cleaning X-ray masks in which an oxygen gas which is supplied is converted into atomic oxygen by a plasma, and in this way organic impurities on the surface of the X-ray masks are cleaned off.

U.S. Pat. No. 4,677,704 has disclosed a system for cleaning a statically charged surface of a semiconductor wafer in which a gas at which vibrations have been produced is passed onto a surface of a wafer, the static charging being kept to a minimum.

JP-A 55 134 851 has disclosed a mask-cleaning apparatus in which a gas which is mixed with ozone is blown at right angles onto a surface of a drying plate, which is held in a drying-plate holder, in order in this way to blow dust off the plate, the dirt-containing gas then being extracted through outlets in the cleaning apparatus.

JP-A 06 168 864 has disclosed a cleaning apparatus in which nitrogen is blown onto a surface of a reticle with the aid of a gas spray, dust being removed from the surface and at the same time being discharged by the nitrogen gas.

U.S. Pat. No. 4,715,392 has disclosed a washing and cleaning device for semiconductor products in which foreign particles are washed off that surface of the semiconductor product which is to be cleaned using a cleaning liquid, after which the semiconductor product is fed to an inspection device for foreign particles and then, if necessary, is returned to the washing and cleaning device.

SUMMARY OF THE EXEMPLARY EMBODIMENTS

This is where the exemplary embodiments intervene, being based on the object of providing measures with which the levels of scrap caused by impurities in the fabrication of semiconductor components can be reduced with the minimum possible outlay. One aspect of the exemplary embodiments is to take up the minimum possible footprint, and it is to be possible for the cleaning to be performed efficiently.

Therefore, the exemplary embodiments propose a cleaning apparatus for semiconductor component production, which is provided with two feed devices, each of which can be used to guide fluid medium over in each case once surface of an object which is to be cleaned, in particular of a semiconductor production means, so that different sides of the object can be cleaned simultaneously, at least two gas feed devices for introducing a cleaning gas which is under super atmospheric pressure opening out into a cleaning chamber, the gas feed devices each having a means for directing a gas stream onto a surface of the object which is to be cleaned, at least two suction means, by means of which gas which has been introduced into the cleaning chamber can be discharged, leading out of the cleaning chamber, and a support being present for holding the object in the cleaning chamber, in which apparatus the object can be introduced into the cleaning chamber through at least one gap in the cleaning chamber, and gas and particles located in the cleaning chamber can be ionized using at least two ionization means, in each case one ionization means being located between in each case one directing means and one suction device.

The first consequence of the measures of the exemplary embodiments is that an object, for example a flat object, used in semiconductor production can simultaneously be cleaned from two sides using a dry fluid or example a gas, so that space and resources are saved.

The object is also achieved by a method in which the object which is to be cleaned is introduced into a cleaning chamber of this type, a gaseous medium is passed onto a surface of the object to be cleaned, for example at an angle of less than 90°, and gaseous medium which is deflected by the surface of the object is extracted.

According to the exemplary embodiments, unlike in previously known cleaning apparatus and methods from semiconductor production, cleaning is carried out using a gaseous—and therefore dry—fluid. Surprisingly, it has been found that gases can also be used to remove soiling particles with a high level of reliability. With the cleaning apparatus according to the exemplary embodiments it is possible to clean semiconductor production means, in particular reticles. Of course, it is also possible, however, to use the apparatus to clean semiconductor products or intermediate products, such as wafers.

In this context, a detection device for detecting soiling which has been deposited on the objects which are to be cleaned is accommodated in the same housing as the cleaning apparatus. The overall footprint required for the two functional units can be reduced in size, since they can use common components, such as a device for preparing clean air, a joint electrical power supply unit and computer unit for controlling the functional units, a handling device, etc. The footprint required becomes particularly small if individual functional units of the apparatus are arranged substantially above one another.

According to a further aspect of the exemplary embodiments, a cleaning apparatus which can be used to clean the objects is integrated in a stocker (storage device) for objects from semiconductor production, in particular reticles. With a combined cleaning and storage apparatus of this type, it is possible to reduce the size of the footprint required, since in this case two individual functional units are integrated in a common housing. Secondly, it is also possible for these functional units to use common components. Examples of these are once again a facility for generating clean room conditions within the housing, a joint handling device, by means of which the semiconductor production means are fed to the individual functional units and removed from them, or a joint control computer. The control computer is advantageously responsible for both control and management functions which relate to the individual functional units themselves and control functions of coordinating sequences between the functional units. The control computer is intended in particular to be responsible for managing the objects which have been temporarily stored in the storage device and to store information about these objects.

On account of the advantages of the cleaning apparatus according to the exemplary embodiments described above, it is expedient for an apparatus of this type also to be provided in a combined cleaning and storage apparatus according to the exemplary embodiments.

In a refinement of the storage device according to the exemplary embodiments, a detection device may additionally be integrated in the housing and can be used to detect soiling which is present on a surface of a semiconductor production means. By way of example, a detection device which is marketed by the applicant under the name "Particle Detection System (PDS)"—and is therefore already known—can be used to check reticles. As the light-emitting element, this device has a laser. The two laser beams which it produces are guided substantially in parallel over the top side (glass side) and underside (pellicle side) of the reticles. If there are dirt particles on one of the sides, the laser beam is diverted at this point. The top side and underside of the reticle are guided past in each case one camera, at a distance therefrom, and the camera is used to measure deflected light. The size and position of individual particles can be determined on the basis of the intensity of the diverted light.

Further configurations of the exemplary embodiments will emerge from the dependent claims, the drawing and the associated description.

BRIEF DESCRIPTION OF THE DRAWINGS

The invention is explained in more detail on the basis of the exemplary embodiments illustrated diagrammatically in the figures, in which.

DETAILED DESCRIPTION

Figure 1:
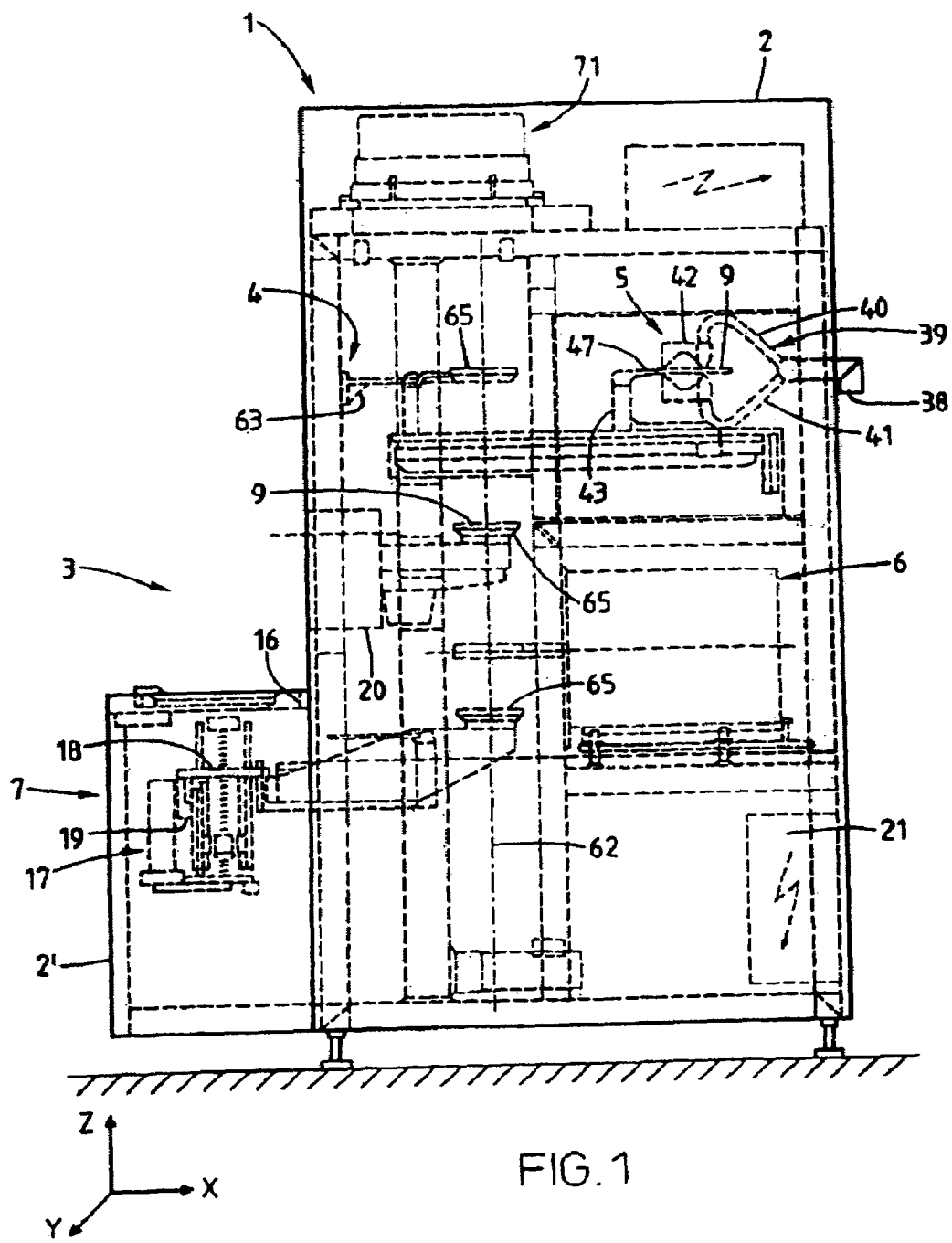
FIG. 1 shows a side view of a storage apparatus according to the invention in which a plurality of functional units are integrated in one housing.

FIG. 1 shows a cleaning and storage apparatus 1 for reticles in accordance with an exemplary embodiment, which has a housing 2 which is substantially rectangular in cross section and which closes off the apparatus 1 on all sides. A plurality of functional units are accommodated in the housing 2 and carry out various functions in connection with the reticles. These include an introduction/discharge device 3, a handling device 4, a cleaning device 5 and a detection device 6.

Figure 2:
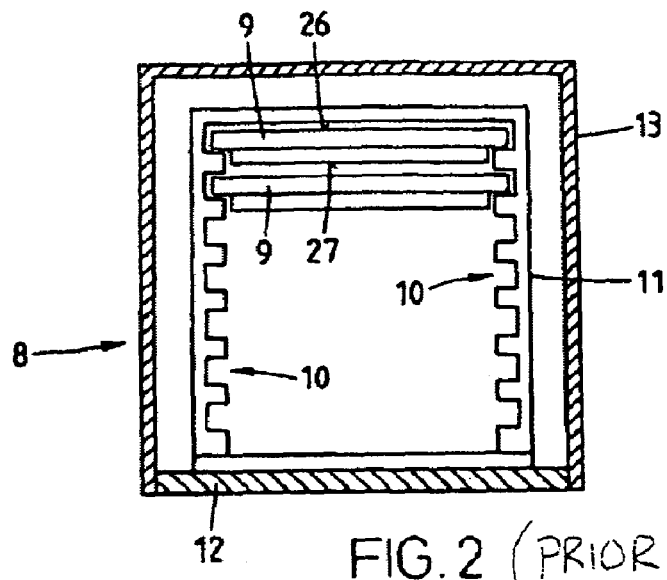
FIG. 2 shows an SMIF container with reticles arranged therein.

On one side of the housing 2, the introduction/discharge device 3 has firstly what is known as an SMIF station 7, by means of which transport containers (not shown), which are known per se, can be opened and reticles arranged therein can be removed. The term SMIF is an abbreviation of "Standard Mechanical Interface" and denotes the standardized transport containers which are customary in the semiconductor sector. FIG. 2 shows a purely diagrammatic view of a container 8 of this type, in which the reticles 9 are arranged in compartments 10 of a magazine 11 of the container 8. The magazine 11 stands on a baseplate 12 of the container, which can be closed off in an airtight manner by a container hood 13, so that in this state the reticles 9 are not exposed to the atmosphere.

The SMIF station 7 shown in FIG. 1 can in principle be of the same design as the same applicant's station which is described in European patent application EP 0 875 921, in the name of the same applicant. Therefore, the content of disclosure of European patent application EP 0 875 921 is incorporated in its entirety by reference in terms of the design structure of the station described therein. Although the SMIF station described in the abovementioned European patent application is an apparatus for handling SMIF containers for wafers, only slight adaptations are necessary in order to handle cassettes for reticles instead of wafers.

The SMIF station 7 is surrounded by part 2' of the housing 2 which is close to the base. On a top side of the housing part 2' there is a stationary frame 16, in which there is a receiving plate 18 which can be displaced vertically downward from a position at the level of the frame 16 by means of a lift device 17 and vice versa. The frame is provided with means (not shown) for fixing the baseplate 12 of the SMIF container 8. Moreover, the hood 13 can be detached from the baseplate 12 by means of a mechanism arranged in the receiving plate 18, and the two elements can be secured to the frame 16 and the receiving plate 18, respectively. In this way, the magazine 11 of an SMIF container 8 which is standing on the baseplate 12 can be automatically removed therefrom as a result of the receiving plate 18 being displaced vertically downward. The reticles 9 arranged in the magazine 11 are in this way introduced into the housing 2 of the apparatus toward a loading and unloading position. In the process, the magazine 11 is guided past a scanning device 19, for example a CCD camera and/or a light barrier sensor, which determined in which compartment a reticle 9 is arranged. If appropriate, the scanning device 19 can also be used to read an identification means, for example a bar code, arranged on each reticle.

On the same side of the housing 2 as the SMIF station 7 and above the latter, there is, as a further component of the introduction/discharge device 3, a cassette station 20, by means of which individual reticles arranged in commercially available cassettes (not shown) can be moved into and out of the housing 2 via a lock. Numerous cassette stations of this type are known per se.

Figure 3:
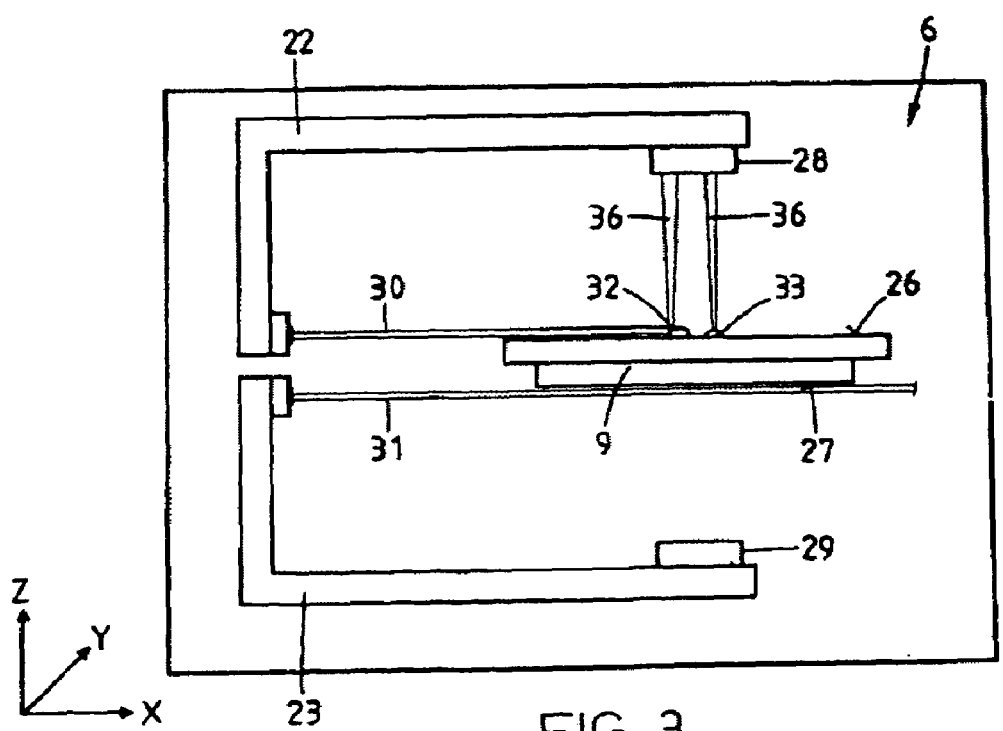
FIG. 3 shows a highly diagrammatic illustration of a detection device.

With respect to a vertical direction, the detection device 6, which is provided with its own housing and the basic structure of which is illustrated in more detail in FIG. 3, is present between the SMIF station and the cassette station 20 above a central electrical power supply unit 21 of the apparatus according to an exemplary embodiment. A reticle 9 is arranged between two arms 22, 23 of a support, on a carriage which is not shown-in more detail and can be displaced in a horizontal X-Y plane. The glass side 26 of the reticle faces upward, and the pellicle side 27 of the reticle faces downward. A high-resolution CCD line-scan camera 28, 29 is arranged on each arm 22, 23.

Moreover, the reticle 9 is located in the beam path of two laser beams 30, 31, which are directed in such a way that one laser beam impinges on the glass side 26 and the other laser beam impinges on the pellicle side 27 of the reticle 9. Both laser beams 30, 31 run with only a slight angle of inclination, and therefore virtually parallel, to and directly above the associated surfaces. Therefore, dirt particles 32, 33 on the surfaces 26, 27 are located in the beam path of the laser beams and deflect the laser beams 30, 31. The corresponding CCD camera 28, 29 detects the deflected light 36 and—should this be of interest—can determine the size of the dirt particles 32, 33 and their position on the reticle 9 as a function of the measured light.

FIG. 1 shows that the cleaning device 5 is arranged above the detection device 6 and is likewise provided with its own housing. The cleaning device 5 has a connection 38, which leads from the outside through the housing 2 of the apparatus 1, for gas which is under super atmospheric pressure, for example pure nitrogen, from a gas feed device 39. The connection leads into two feed pipes 40, 41 which are connected to a cleaning chamber 42. Moreover, the cleaning chamber 42 can be connected to a suction means in a manner which is not illustrated in more detail. Moreover, the cleaning device 5 is provided with a carriage 43 which can be displaced along an X-axis (i.e. horizontally in the plane of the drawing shown in FIG. 1). The carriage has, as support for reticles, a gripper 47, by means of which a horizontally oriented reticle 9 can be gripped at one of its ends.

Figure 4:
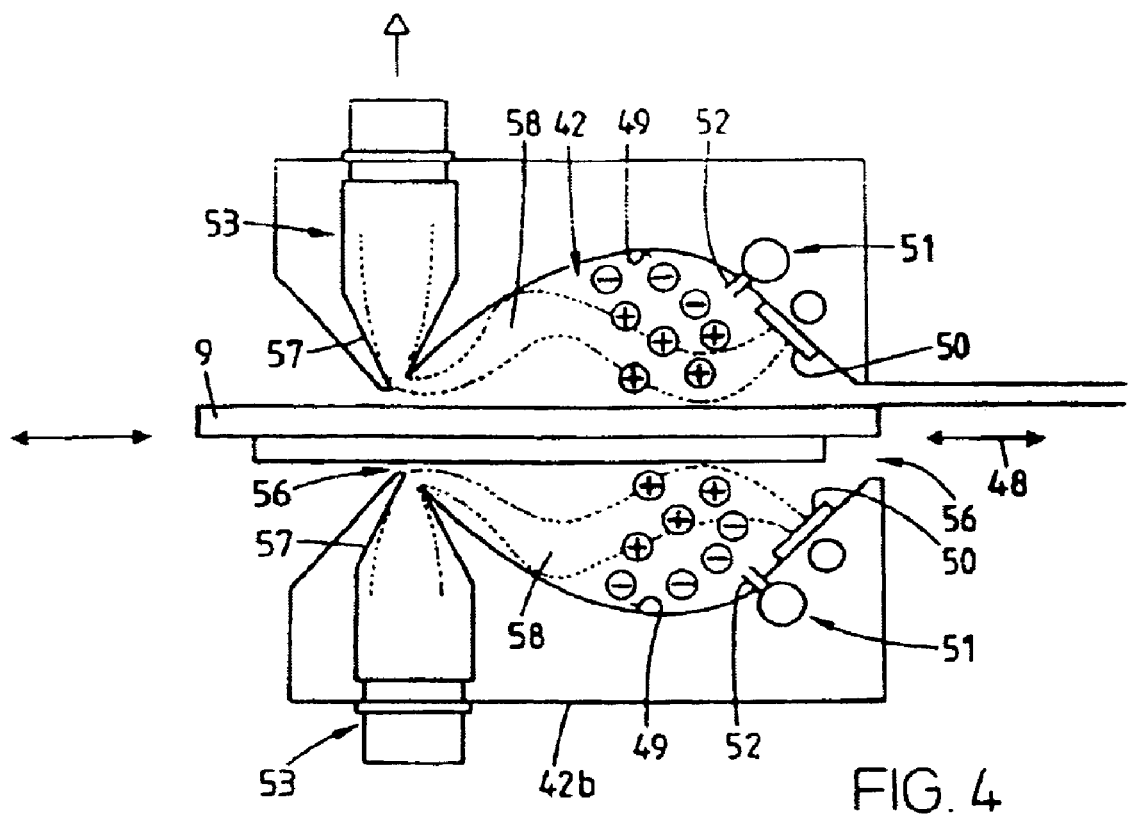
FIG. 4 shows an exemplary embodiment of a cleaning apparatus according to the invention.

As can be seen from FIG. 4, the cleaning chamber 42 of the cleaning device 5 is formed symmetrically with respect to a substantially horizontally running X-Y plane, in which the reticle also moves in the directions indicated by the double arrow 48. The cleaning chamber 42 is therefore composed of two mirror-symmetrically identical upper and lower halves 42a, 42b, which each have an approximately concavely curved chamber wall 49. In the region of an end of each chamber wall 49, a gas feed has a feed outlet or nozzle 50 of the gas feed device 39 that opens out into the cleaning chamber 42. Next to each nozzle 50 there is an ionization means 51, the electrodes 52 of which project into the chamber. The electrodes 52 are occupied by titanium emitters which extend over the entire width of the chamber and emit positive and negative ions into the chamber. The ions are generated by a generator which is not shown in more detail and is connected to the electrodes 52.

At the other end of the chamber 42, a suction device 53 is arranged in each of the two chamber halves 42a, 42b and is connected, in a manner which is not illustrated in more detail, to the suction means for generating a subatmospheric pressure. Between the two chamber halves 42a, 42b, there is a gap 56 at both the front and rear ends of the chamber, through which a reticle 9 can be passed through the chamber 42. Both a width of the chamber 42 (dimension orthogonally to the plane of the drawing in FIG. 4) and a height of the gap 56 (vertical direction in FIG. 4, i.e. parallel to the thickness of the reticle 9) are only insignificantly larger than a reticle 9 itself. A diffuser 57 of each suction device 53 is located at the narrowest point of the gap 56, i.e. the location at which the gap 56 is at the shortest distance from the reticle. By way of example, a height of the gap could amount to at most the thickness of the reticle 9 plus at most 22 mm, preferably plus at most 0.5 mm to 1 mm.

With the aid of the carriage 43 and its gripper 47 (FIG. 1), the reticle 9 in question can be guided through the chamber 42, so that the gas streams 58 emerging from the nozzles 50 can be directed onto any point on the top side and underside of the reticle (FIG. 4). The gas streams 58 can each impinge on the corresponding reticle surface at an angle of incidence of approximately 30° to 60°, preferably of approx. 45°. The two gas streams 58 are reflected by the top side or underside of the reticle at a reflection angle which substantially corresponds to the angle of incidence. In this context, it is preferable if a flow component of the emerging gas which is parallel to the reticle 9 is directed oppositely to the direction of movement of the reticle 9 in the chamber 42 during the cleaning process. Soiling, in particular particles, which has been deposited on the top side or underside of the surfaces is detached and entrained by the corresponding gas stream 58.

To prevent the particles in the gas stream 58 or the cleaning chamber from being statically charged and deposited on the reticle 9 or the cleaning device, the ionization means performs an active ionization. This is to be understood as meaning that statically charged particles are neutralized by the generation of positive and negative ions.

The gas streams 58 then move in an approximately wavy form toward the diffusers 57 of the suction device and the gap 56. Both the kinetic energy of the gas streams 58 and the subatmospheric pressure generated by the suction devices contribute to this movement. The gas is then sucked out of the chamber through the diffusers 57.

A further functional unit of the apparatus according to the invention which is shown in FIG. 1 may be a storage device for a multiplicity of reticles 9. A storage device of this type may include compartments, which are arranged in rows and columns, for receiving and temporarily storing reticles. The receptacles may substantially be slots into which the reticles are pushed. In the illustration shown in FIG. 1, the receptacles may be located in front of and behind the Z axis.

As can be seen from FIG. 1, the handling device 4 of the apparatus 1 is arranged between the SMIF station 7 and the cassette station 20, on the one hand, and detection device 6 and the cleaning device 5, on the other hand. The handling device 4 has a vertically oriented linear Z axis 62, on which a carriage 63, which can be displaced in the Z direction and is only indicated in FIG. 1, is arranged. The carriage is illustrated in more detail in FIGS. 5 and 6. It can be used to transfer reticles to transfer locations 65 which are in each case installed in a fixed position in front of the individual functional units and to pick them up from the transfer locations 65.

Figure 5:
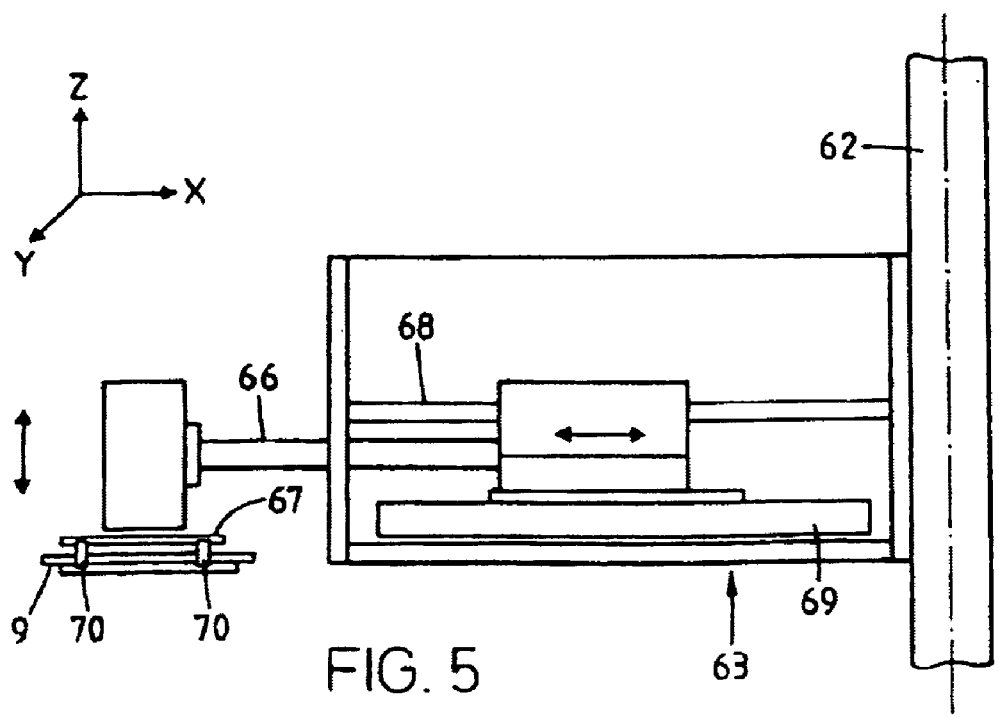
FIG. 5 shows a gripper of a handling device of the apparatus according to the invention.
Figure 6:
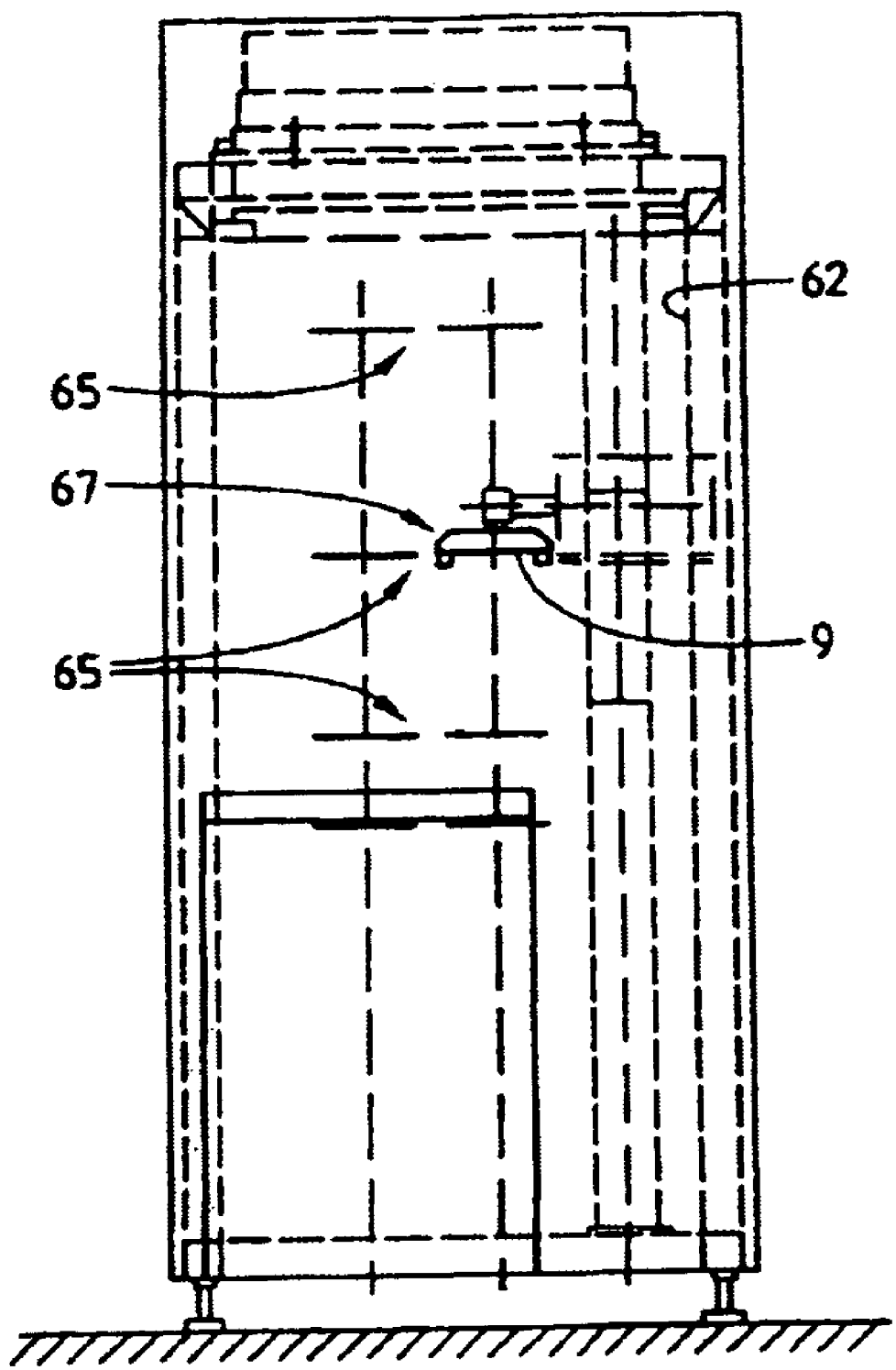
FIG. 6 shows the storage apparatus from FIG. 1, in a simplified illustration of a further side view.

The carriage 63 is illustrated in more detail in FIG. 5. It has a support arm 66, on which a pneumatically driven gripper 67 for handling individual reticles 9 is arranged. Moreover, the support arm 66 can be pivoted through at least 180° about the Z axis, so that the gripper 67 can transfer or remove reticles to or from all the functional units of the apparatus according to the invention. Moreover, the support arm 66 can be displaced in the X direction along its longitudinal axis. For this purpose, it is mounted on a guide shaft 68 by means of ball sleeves and is driven to carry out this movement by a pneumatic cylinder 69. The gripper 67 can therefore be arranged at different distances from the Z axis. The gripper 67 has in each case two pairs of clamping fingers 70, between which in each case one reticle 9 can be gripped by side faces. Therefore, the handling device 4 is used to convey the reticles between the individual functional units and to transfer them to these units.

Finally, as shown in FIG. 1, a device 71 for providing the clean air, which flows from the top downward in the housing, and for generating the direction of flow of the clean air is provided above the Z axis 62. The air can emerge through slots (not shown) which are present in the base of the housing 2. Numerous devices 71 of this type are known per se and are used primarily to discharge any particles which are present in the housing 2 before they can be deposited.

The individual functional units of the apparatus according to an exemplary embodiment are controlled and coordinated by a central computer unit (not shown in the drawing). By way of example, a functional sequence of the apparatus can begin by a reticle being removed from its cassette in the cassette station 20, the bar code of the reticle 9 being read and this information identifying the reticle being stored in a memory of the computer unit. Then, the reticle 9 is picked up at the cassette station 20 by the gripper 67, transferred to the detection device 6 and given over to the latter. In the detection device 6, the reticle is inspected for soiling. The number, size and location of the particles on the glass side and the pellicle side are measured, and the measured values are stored in the memory as further information relating to the corresponding reticle 9.

If the examination shows that cleaning is necessary, the gripper 67 moves the reticle 9 from the detection device 6 to the cleaning device 5, in which the reticle is cleaned in the manner described above. Before the reticle is then either placed back into a cassette in the cassette station or placed into a compartment of the storage device, it may optionally be moved back to the detection device 6. The effect of cleaning can be monitored or checked by examining the reticle again after the cleaning operation. Alternating cleaning and checking of the reticle can be repeated automatically until there is no longer any soiling larger than a defined particle size. It is also possible for the reticle to be cleaned before a first inspection and only then for an inspection to be carried out in the detection device. If the reticle satisfies the predefined cleanness requirements and is to be placed into the storage device for temporary storage, the gripper 67 moves it to in front of a receptacle which has been predetermined by the computer unit and the reticle is placed into this receptacle. As soon as this operation has ended, information identifying the corresponding receptacle is also added to the stored information about the reticle in question, so that the reticle can easily be found again. If the reticle is to be taken out at a later time, the corresponding reticle can be requested via an input device (not shown), whereupon the gripper 67 moves to the corresponding receptacle, removes the reticle, takes it to the introduction/discharge device and transfers it to this device, after which the reticle is discharged. In the process, the reticle once again moves past one of the scanning devices, which read the bar code of the reticle and record this reticle in the computer unit as having been discharged.

With regard to the arrangement of the individual functional units in the apparatus according to the exemplary embodiments, it will be obvious that numerous variations are possible. It is also possible for some of the functional units shown in FIG. 1 to be omitted if their functions are not required. For example, it is also possible for the apparatus to have only one or two transfer stations (SMIF station 7 and/or cassette station 20) of an introduction/discharge device and a detection device 6 in the housing. It is optionally also possible for a storage device to be present in this housing. In this case, the reticles can be cleaned outside the housing in a separate cleaning device.

In a refinement of the latter exemplary embodiment, a cleaning device may additionally be added to the introduction/discharge station and the detection device. Apart from the storage device, this exemplary embodiment may correspond to the apparatus illustrated in FIG. 1. Finally, it may also be advantageous if, in the apparatus according to the exemplary embodiment, all the functional units are arranged at substantially the same height. For this purpose, the apparatus may, for example, be circular in cross section and the functional units, apart form the handling device, may be distributed substantially uniformly over the circumference of the cross section. The handling device may be arranged in the center, so that it has access to all the functional units. In another exemplary embodiment, the cross section may be rectangular and the functional units may be distributed uniformly over the two longitudinal sides.

What is claimed is:

1. A cleaning apparatus for semiconductor component production object, which is provided with two feed devices, each of which can be used to guide a fluid medium over a respective surface of the object which is to be cleaned so that a first and a second surface of the object can be cleaned simultaneously, the first surface being on a separate plane than the second surface, at least two gas feed devices for introducing a cleaning gas which is under superatmospheric pressure opening out into a cleaning chamber one of the at least two gas feed devices having an outlet for directing a gas stream onto the first surface of the object and another of the at least two gas feed devices having an outlet for directing a gas stream onto the second surface of the object, where the first and second surfaces are to be cleaned, the gas streams impinging the first and second surfaces of the object at an angle of less than 90°, at least two suction means, by means of which gas which has been introduced into the cleaning chamber can be discharged, leading out of the cleaning chamber, and a support being present for holding the object in the cleaning chamber, in which apparatus
- at least one object positioning gap in the cleaning chamber,
- at least two ionization means, in each case one ionization means being located between in each case one directing means and one suction means, wherein each of the two ionization means is separated from the directing means.

2. The cleaning apparatus as claimed in claim 1, characterized in that the gap is no more than 2 mm wider than a thickness of the object.

3. The cleaning apparatus as claimed in claim 1, characterized in that the suction means is in each case formed in the vicinity of the gap.

4. The cleaning apparatus as claimed in claim 3, characterized in that the suction means is in each case formed with a passage which is delimited by the gap.

5. The cleaning apparatus as claimed in claim 1, characterized in that the support has a displaceable gripper.

6. The cleaning apparatus as claimed in claim 5, characterized in that the object which is to be cleaned can be introduced into and removed from the cleaning chamber by means of the displaceable gripper.

7. The cleaning apparatus as claimed in claim 1, characterized in that the cleaning chamber is of substantially symmetrical construction with respect to the plane in which the object which is to be cleaned can be introduced into the chamber through the gap.

8. The cleaning apparatus as claimed in claim 1, characterized in that the suction means are arranged substantially in the direction of flow of the gas with respect to the directing means.

9. The cleaning apparatus as claimed in claim 1, characterized by a detection device for detecting soiling on objects.

10. The cleaning apparatus as claimed in claim 1, characterized in that cleaning of both sides of intermediate products of semiconductor components occurs simultaneously.

11. An apparatus for storing staged objects from semiconductor production that are staged to be cleaned, comprising a housing which is closed on all sides and in which there is a storage device with storage spaces for receiving and storing the objects, a handling device located within the housing for handling staged objects within the housing, and a discharge/introduction station for the objects in order for them to be taken out of and moved into the storage device, characterized in that a cleaning device as described in claim 1 is present in the housing for cleaning deposited particles from the objects.

12. The apparatus as claimed in claim 11, characterized by a detection device, which is arranged in the housing, for detecting soiling on semiconductor production means.

13. The apparatus as claimed in claim 12, characterized in that the detection device has at least one means for emitting light, by which at least one light beam can be guided onto at least on receiver means, by which the light reflected from the object is received and is fed to an evaluation unit in the form of a measurement signal, and this evaluation unit determines, on the basis of the measurement signal, whether the object is soiled.

14. A method for cleaning objects from semiconductor production comprising providing a cleaning chamber according to claim 1, in which a gaseous medium is passed over the object, and the medium, which has been passed over the object is ionized and extracted.

15. The method as claimed in claim 14, characterized in that the medium at least predominately contains nitrogen.

16. The apparatus as claimed in claim 1, wherein one of the at least two ionization means being located on a first half of the cleaning chamber between one directing means and one suction means and another one of the at least two ionization means being located on a second half of the cleaning chamber between one directing means and one suction means for ionizing the cleaning gas and soiling particles located in the cleaning chamber.

17. The apparatus as claimed in claim 11, wherein the objects are reticles.

18. The apparatus as claimed in claim 13, wherein the at least one light beam is a laser beam.

* * * * *